United States Patent [19]
Biegelsen et al.

[11] Patent Number: 5,607,876
[45] Date of Patent: Mar. 4, 1997

[54] FABRICATION OF QUANTUM CONFINEMENT SEMICONDUCTOR LIGHT-EMITTING DEVICES

[75] Inventors: David K. Biegelsen, Portola Valley; Nicholas K. Sheridon, Los Altos; Noble M. Johnson, Menlo Park, all of Calif.

[73] Assignee: Xerox Corporation, Stamford, Conn.

[21] Appl. No.: 581,287

[22] Filed: Dec. 29, 1995

Related U.S. Application Data

[62] Division of Ser. No. 276,743, Jul. 18, 1994, abandoned, which is a continuation of Ser. No. 783,945, Oct. 28, 1991, abandoned.

[51] Int. Cl.$^6$ ................................................. H01L 21/20
[52] U.S. Cl. ........................... 437/129; 437/62; 437/126; 437/133
[58] Field of Search ................................. 257/17, 22, 13, 257/96, 97, 87; 372/45, 50; 437/126, 129, 133, 62

[56] References Cited

U.S. PATENT DOCUMENTS

| | | | |
|---|---|---|---|
| 4,211,586 | 7/1980 | Fang | 257/90 |
| 4,802,187 | 1/1989 | Bouley | 372/96 |
| 4,862,231 | 8/1989 | Abeud | 257/506 |
| 4,875,086 | 10/1989 | Mahli et al. | 287/506 |
| 4,910,165 | 3/1990 | Lee et al. | 257/506 |
| 4,999,682 | 3/1991 | Xu | 257/13 |
| 5,033,053 | 7/1991 | Shimizu et al. | 372/50 |
| 5,045,894 | 9/1991 | Wigita et al. | 257/18 |
| 5,054,030 | 10/1991 | Sakaki | 372/45 |

FOREIGN PATENT DOCUMENTS 0170044  2/1986  European Pat. Off. .

OTHER PUBLICATIONS

Reed et al, *Physical Review Letters* vol. 60 No. 6 8 Feb. 1988, "Observation . . . Nanostructure" pp. 535–537.

Paasche et al *IEEE Trans. on Elect. Devices* vol. 36 No. 12 Dec. 1989 pp. 2895–2900 "Amorphous—SiC . . . Layers".

"Visible Light from Porous Si: An Open Door to Silicon-Based Optoelectronics?" Sponsored by Symposium B: Silicon Molecular Beam Epitaxy. 1991 MRS Spring Meeting Anaheim, California, Thursday, 2 May 1991.

Ein Neuer Stern Am Halbleiterhimmel. Elecktronik. vol. 40, No. 19, 17 Sep. 1991, Munchen De. p. 18.

Venkatasubramanian, R.; Malta, D. P.; Timmons, M. L.; Hutchby, J. A. Visible Light Emission From Quantized Planar Ge Structures. Applied Physics Letters. vol. 59, No. 13, 23 Sep. 1991, New York, U.S.A., pp. 1603–1605.

Halimaoui, A.; Oules, C.; Bomchil, G.; Bsiesy, A.,; Gaspard, F.; Herino, R.; Ligeon, M.; Muller, F. Electroluminescence in the Visible Range During Anodic Oxidation of Porous Silicon Films. Applied Physics Letters. vol. 59, No. 3, 15 Jul. 1991, New York, U.S.A. pp. 304–306.

(List continued on next page.)

*Primary Examiner*—R. Bruce Breneman
*Assistant Examiner*—Ramamohan Rao

[57] ABSTRACT

The present invention consists of an electroluminescent structure and method of fabrication of that structure in materials which have an indirect bandgap in their bulk form. The processing steps can all be standard VLSI methods. Quantum columns, quantum wires or quantum dots may be formed, for example in an array, by masking, reactive ion etching and oxidation. When the semiconductor core is sufficiently thin, quantum mechanical confinement effects raise the energy and the radiative recombination efficiency of injected carriers. Tuning the core diameters allows selection of individual or multiple wavelength emission bands.

24 Claims, 7 Drawing Sheets

OTHER PUBLICATIONS

Canham, L. T. Silicon Quantum Wire Array Fabrication by Electrochemical and Chemical Dissolution of Wafers. Applied Physics Letters. vol. 57, No. 10, 3 Sep. 1990, New York, U.S.A. pp. 1046–1048.

U. Gnutzmann et al., *Theory of Direct Optical Transitions in an Optical Indirect Semiconductor with a Superlattice Structure*, Appl. Phys., vol. 3, p. 9 (1974).

M. Hybertsen et al., *Theory of Optical Transitions in S/Ge(001) Strained–Layer Superlattices*, Phys. Rev. B, vol. 36, No. 18, p. 9683 (1987).

D. G. Thomas et al., *Isoelectronic Traps Due to Nitrogen in Gallium Phosphide*, Phys. Rev., vol. 150, No. 2, p. 680 (1966).

H. Ennen et al., *1.54 µm Electroluminescence of Erbium–Doped Silicon Grown by Molecular Beam Epitaxy*, Appl. Phys. Lett., vol. 46, No. 4, p. 381 (1985).

Akiyama et al., *Growth of GaAs on Si and its Applications to FETs and LEDs*, Mat. Res. Soc. Symp. Proc. 67, p. 53 (1986).

Yablonovich et al., *Van der Waals Bonding of GaAs Epitaxial Liftoff Films Onto Arbitrary Substrates*, Appl. Phys. Lett., vol. 56, No. 24, p. 2419 (1990).

Holonyak et al., *Quantum–Well Heterostructure Lasers*, IEEE J. Quant. Elect., vol. QE–16, No. 2, p. 170, (1980).

D. J. DiMaria et al., *Electroluminescence Studies in Silicon Dioxide Films Containing Tiny Silicon Islands*, J. Appl. Phys. 56, No. 2, p. 401 (1984).

S. Furukawa et al., *Three Dimensional Quantum Well Effects in Ultrafine Silicon Particles*, Japanese J. Appl. Phys., vol. 27, No. 11, p. L2207 (1988).

M. I. J. Beale et al., *Microstructure and Formation Mechanism of Porous Silicon*, Appl. Phys. Lett., vol. 46, No. 1, p. 86 (1985).

L. T. Canham, *Silicon Quantum Wire Array Fabricated by Electrochemical and Chemical Dissolution of Wafers*, Appl. Phys. Lett. 57, No. 10, p. 1046 (1990).

D. B. Kao et al., *Two–Dimensional Thermal Oxidation of Silicon—I. Experiments*, IEEE Trans. on Electron Dev., vol. ED–34, No. 5, p. 1008 (1987).

R. Okada et al., *Oxidation Property of Silicon Small Particles*, Appl. Phys. Lett. 58, No. 15, p. 1662 (1991).

D. Liu et al., *Fabrication of Wedge–Shaped Silicon Field Emitters With nm–Scale Radii*, Appl. Phys. Lett. 58, No. 10, p. 1042 (1991).

H. W. Deckman, *Applications of Surface Textures Produced With Natural Lithography*, J. of Vacuum Science and Tech. B, vol. 1, No. 4, p. 1109 (1983).

A. Scherer et al., *Fabrication of Microlasers and Microresonator Optical Switches*, Appl. Phys. Lett., vol. 55, No. 26, p. 2724 (1989).

M. B. Stern et al., *Fabrication of 20–nm Structures in GaAs*, Appl. Phys. Lett., vol. 45, No. 4, p. 410, (1984).

FABRICATION OF QUANTUM CONFINEMENT SEMICONDUCTOR LIGHT-EMITTING DEVICES

This is a division of application Ser. No. 08/276,743, filed Jul. 18, 1994, abandoned, which is a continuation of application Ser. No. 07/783,945, filed 28 Oct. 1991, now abandoned.

BACKGROUND OF THE INVENTION

The present invention relates generally to the emission of light by semiconductors. More particularly, the present invention relates to a method and apparatus for obtaining light emission from indirect bandgap semiconductor materials, such as crystalline silicon, the apparatus being compatible with and capable of being formed by known VLSI-process technologies.

An LED is a two-terminal (p-n junction), rectifying electronic device which, when forward biased, causes electrons and holes to recombine and in so doing emit light. When the LED is fabricated within a semiconductor the electrons are supplied to the p-n junction region from the n-type region and the holes are supplied from the p-type region. The energy of the emitted light (and hence its wavelength) is equal to the difference in energies of the two recombining carriers. For semiconductors, the energy difference is usually very nearly equal to the bandgap energy. For many semiconductors, most notably gallium arsenide (GaAs), the band gap is "direct" which means that the electron and hole can recombine by simply emitting a photon to carry off the energy difference. For other semiconductors, such as silicon (Si), the band gap is "indirect" which means that a phonon or lattice vibration must be excited in the process of light emission. The consequence is that indirect gap materials are a thousand to a million times less efficient at light emission (i.e., less light and more heat are emitted from the electron-hole recombination) than direct gap materials. For this reason, the predominant solid state LEDs seen today are fabricated from direct gap materials such as GaAs and its alloys.

There are many examples of semiconductors which have, to date, not been practical for use as light emitters because of their indirect bandgap. Examples include silicon, germanium, AlGaAs for high Al concentrations, etc. Silicon is a very important specific case of a semiconducting material limited by its indirect gap. Many novel technologies would be enabled if Si could be made to emit light efficiently. Functional integration of optoelectronic capabilities with the digital and analog processing capabilities of Si would allow monolithic fabrication of high speed, wireless interconnections on, or between, chips and/or boards, high bandwidth, wireless local area networking, light-induced marking methods, etc.

Various schemes have been pursued to effectively convert the indirect gap to a direct gap in Si and its alloys. One such approach utilizes band folding generated by a superlattice of indirect gap materials. See U. Gnutzmann et al., *Theory of Direct Optical Transitions in an Optical Indirect Semiconductor with a Superlattice Structure*, Appl. Phys., vol. 3, p. 9 (1974). Although this method has apparently worked to produce a direct gap, the resulting material has a very small cross section for radiative recombination. See, e.g., M. Hybertsen et al., *Theory of Optical Transitions in S/Ge(001) Strained-Layer Superlattices*, Phys. Rev. B, vol. 36, no. 18, p. 9683 (1987). The excited carriers therefore have time to find other recombination channels which are generally non-radiative. The important device criterion of high efficiency, namely a high ratio of number of photons emitted per carrier-pair recombination, is therefore not met.

Another approach has been to incorporate impurities into the indirect gap material to localize electron-hole recombination at the impurity atoms. The wavefunctions of the carriers are thereby modified, resulting in direct-gap type recombinations. Two examples of this are Nitrogen in GaP (D. G. Thomas et al., *Isoelectronic Traps Due to Nitrogen in Gallium Phosphide*, Phys. Rev., vol. 150, no. 2, p. 680 (1966)), and Erbium in Si (H. Ennen et al., 1.54 µm *Electroluminescence of Erbium-Doped Silicon Grown by Molecular Beam Epitaxy*, Appl. Phys. Lett., vol. 46, no. 4, p. 381 (1985)). The former case has thus far not been generalized to other semiconductor materials. For example, in the latter case, the maximum recombination efficiency is very small and the impurities are ineffective for radiative recombination at room temperature. Again, the efficiency criterion fails.

Much effort has also been expended to join direct gap materials with silicon to achieve the integration. Attempts have included trying to grow GaAs directly on Si. See, e.g., Akiyama et al., *Growth of GaAs on Si and its Applications to FETs and LEDs*, Mat. Res. Soc. Symp. Proc. 67, p. 53 (1986). This has had only limited success to date. Also, hybrid techniques have been developed such as bonding GaAs devices to Si wafers (as disclosed by Yablonovich et al., in *Van der Waals Bonding of GaAs Epitaxial Liftoff Films Onto Arbitrary Substrates*, Appl. Phys. Lett., vol. 56, no. 24, p. 2419 (1990)). Both of these integrative techniques introduce complications into the Si device processing because new steps are required which are not part of standard Si device fabrication methods.

It is believed that one method for converting an indirect gap semiconductor to a direct gap semiconductor is to localize the wavefunctions of the carriers in the indirect gap material. If a carrier is confined, quantization of the carrier's wavefunction occurs in the dimension of confinement, thereby restricting the energy of the carrier to discrete values $E_n$ with n=1,2,3, . . . (See, for example, Holonyak et al., *Quantum-Well Heterostructure Lasers*, IEEE J. Quant. Elect., vol. QE-16, no. 2, p. 170, (1980)). These levels ("quantum levels") are typically illustrated by a bound-state diagram such as that shown in FIG. 1 for a $SiO_2/Si$ quantum well structure. Various studies have demonstrated that as the thickness of the semiconductor layers in which the carriers are confined approaches the carrier de Broglie wavelength ($\lambda=h/p$, where h is Planck's constant and p is carrier momentum) the separation between levels becomes significant (e.g., greater than the thermal energy of the carriers—25 mV at room temp.) Associated with this quantum confinement of carriers is a shifting of photoluminescence (PL) peak energies to higher values (shorter wavelengths) and increased efficiency of bandedge recombination. Quantum well, quantum wire and quantum dot structures are canonical examples of this technique.

Figure 1:
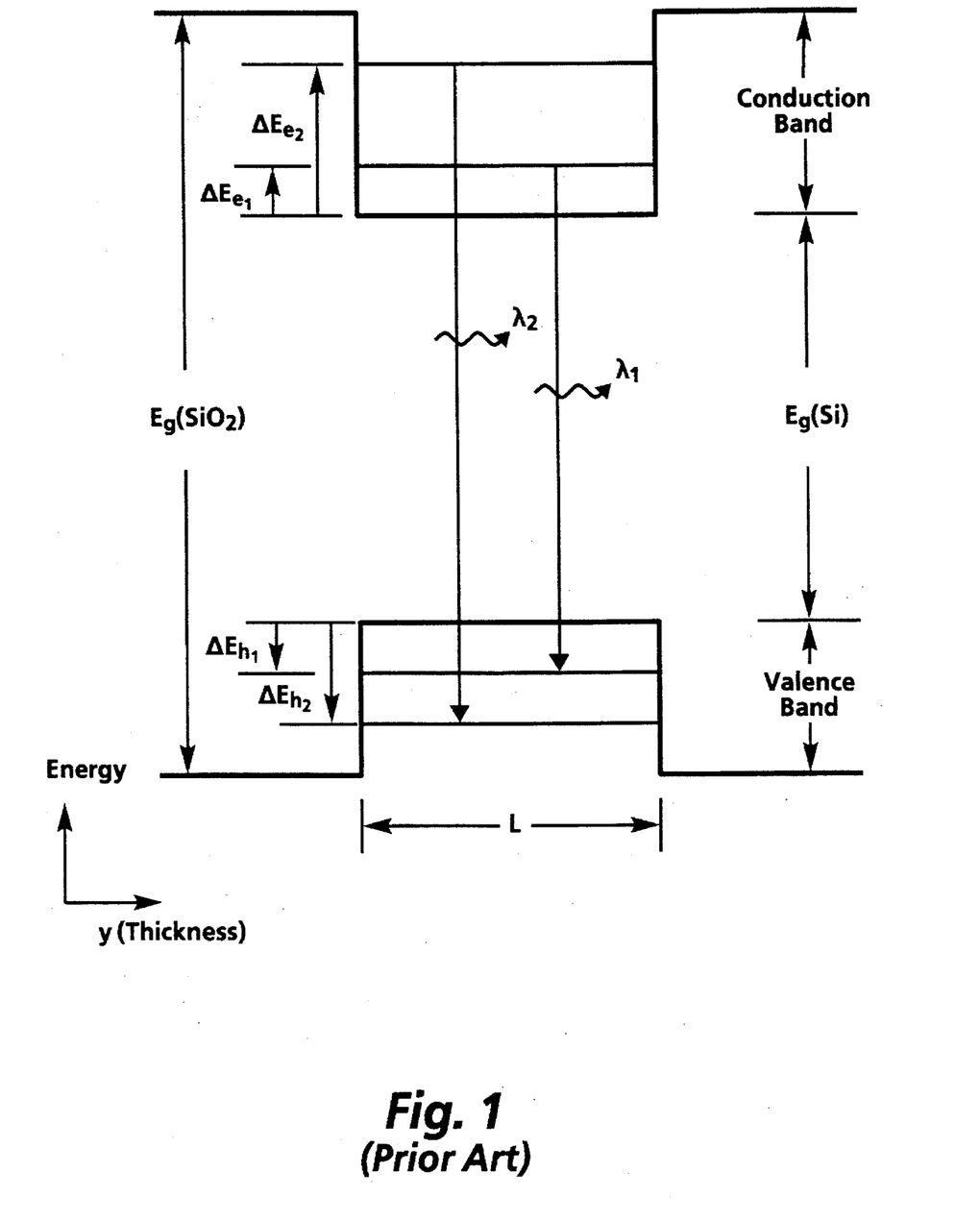
FIG. 1 is an illustration of a typical energy band diagram of Si spatially confined by $SiO_2$, illustrating quantization in one dimension resulting in a series of discrete energy levels ("quantum levels").

Consider a very simple but rather accurate approximation as a useful model of quantum confinement effects. For a d-dimensional infinitely deep, rectangular potential well, the energy levels are given by $$E = (\Pi^2 \hbar^2/2) \Sigma_i \frac{n_i^2}{m_i L_i^2} \quad (1)$$

where $\hbar$ is Planck's constant divided by $2\pi$, $n_i$, the quantum number, is an integer greater than or equal to 1 (equal to the number of half waves the particle wavefunction has packed between the confining walls), $m_i$ is the carrier effective mass, and $L_i$ is the well width for the ith dimension. The lowest energy occurs for all $n_i=1$. Thus in "d" dimensions, for an isotropic mass and all $L_i=L$ (square well), $E=d\pi^2\hbar^2/2mL^2$. As shown in FIG. 1, the energy of an electron in a quantum confined semiconductor will thus be increased by an amount $\Delta E_{e_1}$, $\Delta E_{e_2}$, etc., and the energy of a hole will thus be increased by an amount $\Delta E_{h_1}$, $\Delta E_{h_2}$ etc. (where the masses are generally different).

The photon emitted from electron-hole recombination has total energy given by $$E=E_g+\Delta E_{e_n'}+\Delta E_{h_n} \quad (2)$$

Figure 2:
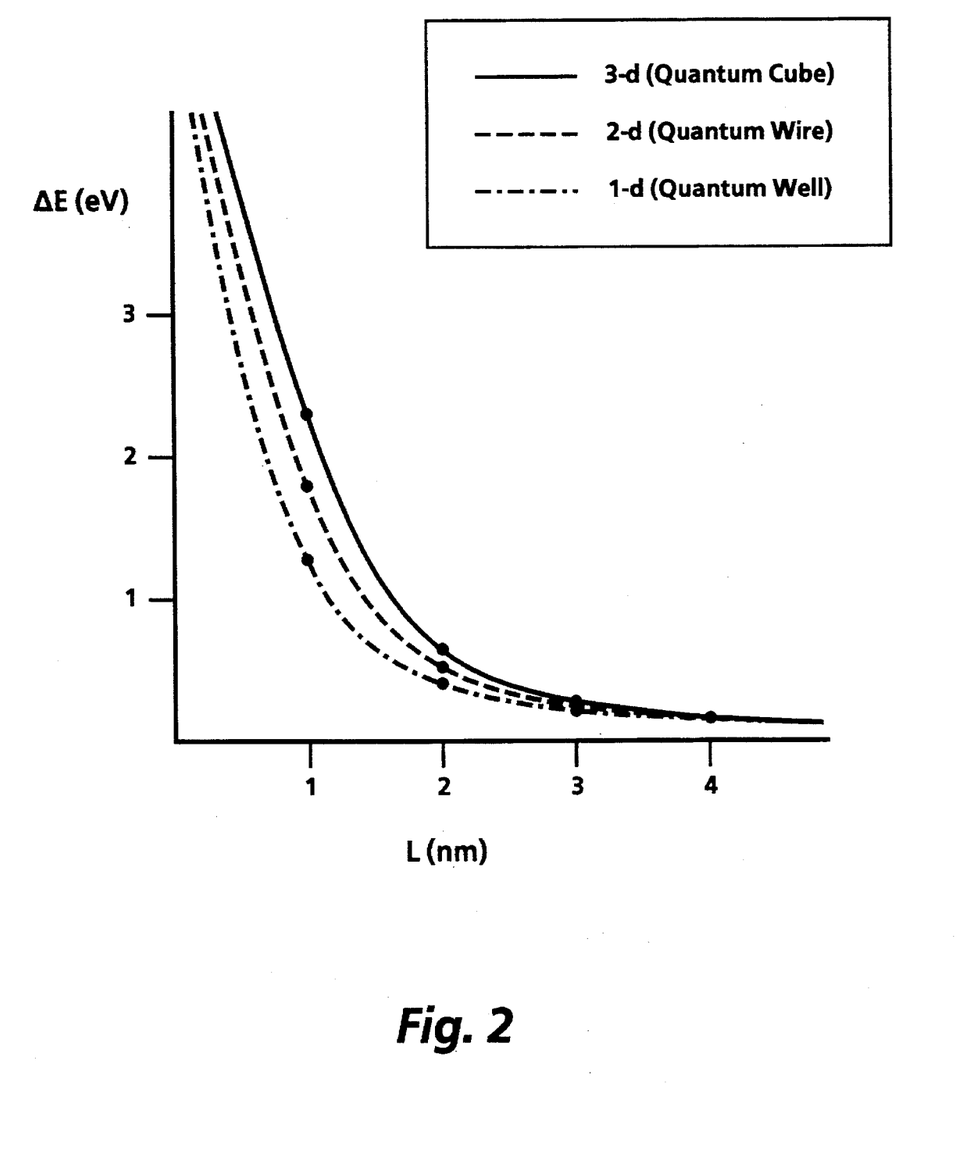
FIG. 2 is a plot approximating the change in energy level versus confinement dimensions for 1-, 2- and 3-dimensional quantum confinement.

For d-dimensional wells assuming for simplicity that $m_e=m_h=m_{free\ electron}$, the increase $\Delta E=\Delta E_{e_n}+\Delta E_{h_n}$ over $E_g$ is $\simeq d/L^2$ in [eV] for L in [nm] and is shown in FIG. 2 for d=1,2 and 3.

Quantum confinement of the carriers also results in a break in the translational invariance of the Si network (i.e., the periodic structure is made more "uncertain") and leads to a breakdown of the bulk momentum selection rules. Thus, phonon generation in the recombination of carriers becomes unnecessary for the generation of photons (i.e., the number of direct transitions increases while the number of indirect transitions decreases) and the efficiency of the device is increased. Moreover, spatial confinement of the electrons and holes in the same small volume increases the wavefunction overlap and thereby the radiative recombination probability.

Examples of electron confinement are now numerous. Several examples exist for crystalline and amorphous silicon, for example, D. J. DiMaria et al., *Electroluminescence Studies in Silicon Dioxide Films Containing Tiny Silicon Islands,* J. Appl. Phys. 56, no. 2, p. 401 (1984), and S. Furukawa et al., *Three Dimensional Quantum Well Effects in Ultrafine Silicon Particles,* Japanese J. Appl. Phys., vol. 27, no. 11, p. L2207 (1988). The most recent work has been on p-type Si formed into small but connected clumps by electrochemical etching (so called "porous silicon" as described for example by M. I. J. Beale et al., in *Microstructure and Formation Mechanism of Porous Silicon,* Appl. Phys. Lett., vol. 46, no. 1, p. 86 (1985)). This porous silicon is formed by immersing a silicon wafer in an acidic electrochemical bath which bores small holes into the wafer. The wafer is then chemically etched to enlarge the holes. This leaves a somewhat random pattern of connected silicon threads, resulting in a sponge-like structure. When cross-sections of the connected Si threads are on the order of 3 nm, visible and reasonably efficient room temperature photoluminescence is observed as demonstrated by L. T. Canham in *Silicon Quantum Wire Array Fabricated by Electrochemical and Chemical Dissolution of Wafers,* Appl. Phys. Lett. 57, no. 10, p. 1046 (1990).

Electroluminescence has been observed in 1- and 2-d confined structures in direct gap materials. Electroluminescence has also been induced by tunneling injection into Si precipitates within silicon dioxide as demonstrated by D. J. DiMaria et al., in *Electroluminescence Studies in Silicon Dioxide Films Containing Tiny Silicon Islands,* J. Appl. Phys. 56, no. 2, p. 401(1984). However, to date it has not been possible to fabricate an electroluminescent device (for example an LED) in Si, or any other indirect gap material, with useful performance characteristics—particularly electro-optical efficiency. It is one purpose of the present invention to provide such devices.

In addition, semiconductor LEDs primarily emit light at a single wavelength, which is principally determined by the semiconductor material from which the LED is formed. Often, the output wavelength of the LEDs must be "tuned" or switched between two or more different output wavelengths to optimize the applicability of the LED. External apparatus such as diffraction gratings, holograms, and the like, have been employed to tune or switch the output wavelength(s) of light emitting devices. Such external tuning arrangements are disadvantaged, though, since they increase the size and complexity of the light source. It is therefore preferable to be able to tune the device by controlling the characteristics of the device itself, and thus it is among the other purposes of the present invention to facilitate improved tunability or switching of the output wavelength of the light emitting device.

SUMMARY OF THE INVENTION

The present invention is a luminescent apparatus configured to provide quantum carrier confinement in multiple (at least 2) dimensions, fabricated from indirect gap material, such as silicon, and a method for manufacturing such an apparatus. The apparatus includes, according to one embodiment, a substrate of semiconductive material, such as crystalline silicon, having formed thereon an array of parallel nano-scale (on the order of 3 nm in diameter) luminescent structures which are configured as 2-d roughly columnar structures which produce substantial confinement of free carriers. In alternate embodiments, in place of the 2-d column structures, planar structures having free carrier confinement (i.e., quantization) in two dimensions (i.e., quantum wires) or structures having free carrier confinement (i.e., quantization) in three dimensions (i.e., weakly connected quantum dots) are formed on the substrate. The mechanical fragility of the 2- or 3-d quantum confined columns, wires or dots due to their size is overcome by providing field material between the structures. This field material also serves to passivate the array. The field material is optically transparent at the wavelength(s) of operation, and may be a byproduct of the formation of the structures themselves. Electrical contact is provided to form an LED, for example, by deposition of a metal contact layer.

The spatial dimensions of the crystalline cores of the quantum columns, wires or dots, define the peak wavelength $\lambda$ of light emission ($\lambda \propto L^2$, where L is the lateral dimension of the quantum confined region). Therefore, selection of the output wavelength of a luminescent apparatus according to the present invention may be accomplished by controlling its size (e.g., the diameter of the column structure). Alternatively, by controlling the processing steps of formation of the array of LEDs, the array may emit several different wavelengths simultaneously, or be fabricated to emit discretely at several different wavelengths and driven independently on one substrate.

When the 2- or 3-d quantum confined structures are forward biased, quantum confined electrons and holes drift towards each other and recombine. This recombination occurs only in the quantum confined structures (i.e., only in the columns, wires or dots, and not in the inter-structure field material). However, since the center-to-center spacing of structures is much smaller than a wavelength of the emitted light, the structures and the inter-structure field material may be considered to be a single homogeneous optical structure having a net index of refraction intermediate to that of the structures and the field material. Therefore, for incoherent emission of photons, light radiates from the array in a nearly Lambertian distribution much as from standard, bulk LEDs using direct gap semiconductors. Furthermore, if efficiencies are made high enough coherent stimulated emission can dominate the spontaneous emission leading to lasing.

Although the invention is general to all indirect gap semiconductor materials, the embodiment and fabrication in crystalline silicon will be used herein as a specific example to simplify the description. Furthermore, although the present invention may yield one of a number of types of luminescent devices, the embodiment and fabrication of a light emitting diode (LED) will be described as a specific example. The broadly defined method of the present invention leading to creation of a Si p-n or p-i-n LED includes creating a degenerately doped, n-type layer (As-doping for example) on a p-type region or wafer or doped region within a Si substrate. Next, an array of dots (of insulative material, for example) are formed on the surface of the n-type layer. Patterning can be done by electron-beam lithography or X-ray lithography. Vertical-walled columns are then formed in the Si by Reactive Ion Etching (RIE) down into the p-type layer using the dots as an RIE mask. The Si columns are then oxidized. The dots also act as an oxidation mask. RIE-induced damage at the Si surfaces is removed in the oxidation process. The oxidation is terminated when the remaining, unoxidized Si in the columns is on the order of 2–3 nm thick. The oxide can then be annealed to allow viscous relaxation and stress relief, if necessary. The insulative dots are selectively etched away and a transparent metal, such as indium tin oxide (ITO), is then deposited to create an electrical contact to the columns. A transparent encapsulating material is then deposited or spun on to further passivate and structurally protect the columns. Each column thus forms an LED, and in operation, the LEDs are then forward biased in parallel to stimulate light emission.

The scope of the present invention and the manner in which it addresses the problems associated with prior art will become more readily apparent from the following detailed description when taken in conjunction with the accompanying drawings and claims.

BRIEF DESCRIPTION OF THE DRAWINGS

In general, as between the various figures, like reference numbers will be used to refer to like elements.

DETAILED DESCRIPTION

Figure 3:
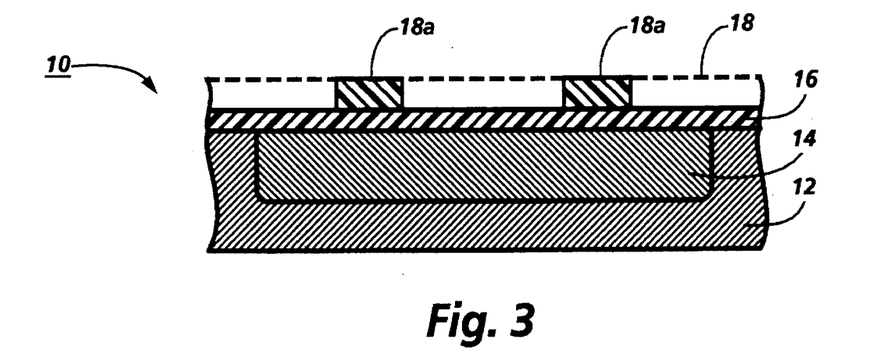
FIG. 3 shows in cross-section a structure at an initial stage in the process of forming a light emitting apparatus from indirect bandgap material according to one embodiment of the present invention.

With reference to FIG. 3, fabrication of a Si LED 10 according to the present invention will now be described. A substrate 12 of crystalline Si, which is VLSI process compatible (and may in fact have already been subject to a number of stages of device processing), has formed therein a p-type region 14, which fills the substrate either partially or entirely to a depth sufficient to contain the LED, for example 100 nm. P-type region 14 may be formed by one of many known techniques such as implantation, etc. A p-n diode junction structure is created by forming in touching relationship with region 14 (and possibly substrate 12) a degenerately doped n-type layer 16. Layer 16 will be formed, for example, by As-doping through epitaxial overgrowth, implantation, diffusion or other means well-known, to a thickness such that it does not extend all the way through p-type region 14. It should be noted that, whereas region 14 has been described as being p-type material and region 16 has been described as being n-type material, one can exchange n and p above and throughout this description without modifying the principles of the present invention nor departing from the spirit or scope of the invention as claimed below. Furthermore, described above is the initial steps in fabrication of a p-n junction device. By simply forming an undoped, intrinsic layer of material (not shown) between layers 14 and 16, the foundation for a p-i-n device may be obtained.

Figure 4:
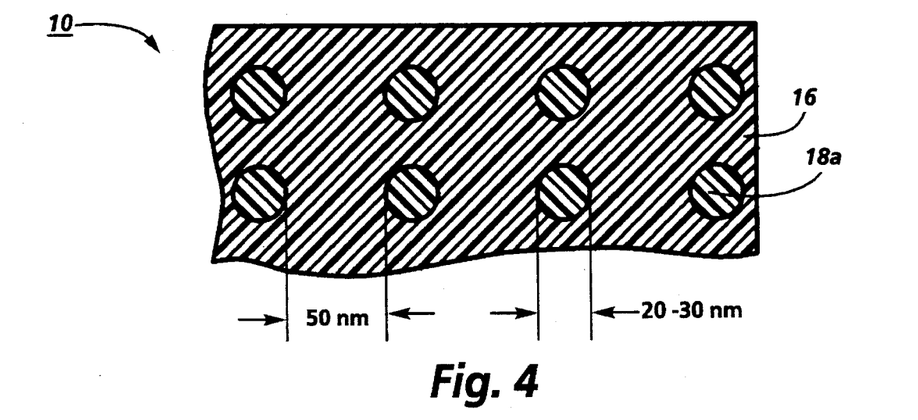
FIG. 4 is a top or plan view of a structure at the stage of processing shown in FIG. 3, illustrating an array of dot structures used to form columnar structures in a light emitting device according to one embodiment of the present invention.

Following formation of layer 16, a material layer 18 is deposited or formed on the upper, exposed surface of layer 16. Layer 18 might typically be an insulating material such as silicon nitride, although other materials including those described below may be employed. Interdiffusion between the material of layer 18 and the material of layer 16 (in this embodiment, silicon) must be minimal. Layer 18 is then patterned and etched so as to leave an array of dots 18a on layer 16, with dot diameters on the order of 20 nm, and typical center-to-center spacing of the dots 18a on the order of 50 nm. The array of dots 18a may be ordered or disordered without departing from the basic idea of the present invention. The process employed to obtain dots 18a must not result in significant oxidation, and interdiffusion must still be minimized. Methods such as e-beam lithography, X-ray (or ultraviolet) lithography, or the like are well suited to obtaining dots 18a complying with these requirements. An ordered array of dots 18a is shown in a top or plan view in FIG. 4.

Figure 5:
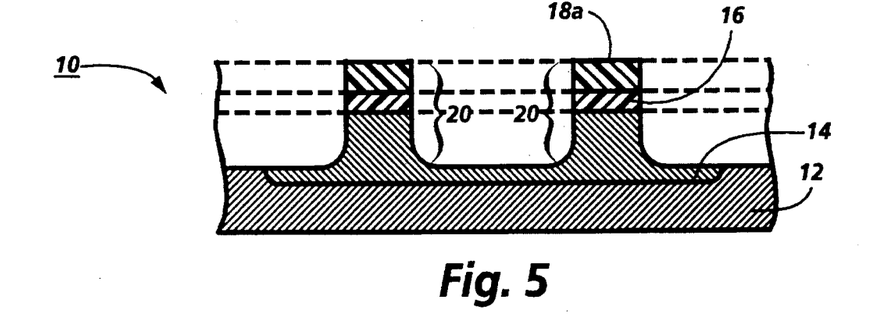
FIG. 5 shows in cross-section the structure of FIG. 3 following the etching stage in the process of forming columnar structures in a light emitting device according to one embodiment of the present invention.
Figure 5A:
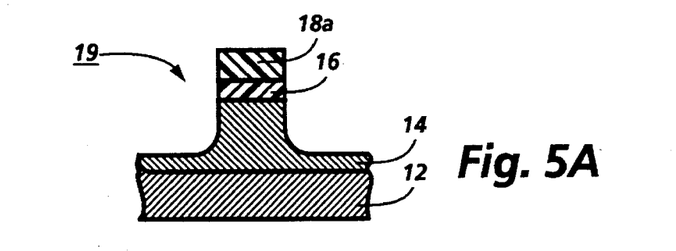
FIG. 5A shows a variation of the structure shown in FIG. 5 having roughly columnar structures with tapering sidewalls as part of the light emitting device according to one embodiment of the present invention.

With the array of dots 18a acting as an etching mask so as to leave unetched the regions of layer 14 and 16 directly thereunder, layers 14 and 16 (and possible substrate 12) are etched by an appropriate process, for example reactive ion etching (RIE). (Although the RIE will typically produce a vertical-walled structure, a structure 19 with a cross section which is slightly wider at the base and conically tapered toward the top, as shown in FIG. 5A is also acceptable.) Vertical-walled columns 20 are thereby formed consisting of stacked regions of p-type material 14, n-type material 16, and insulative material (dots 18a). This structure is shown in FIG. 5. Depending on the method employed to form dots 18a and the method of etching layers 14, 16, etc., other materials such as photoresist, etc. (not shown) may also be stacked on the column. The etching is performed so as to leave each column 20 interconnected by a portion of the p-type material of layer 14, for example by etching only partway through layer 14, as shown in FIG. 5.

Figure 6:
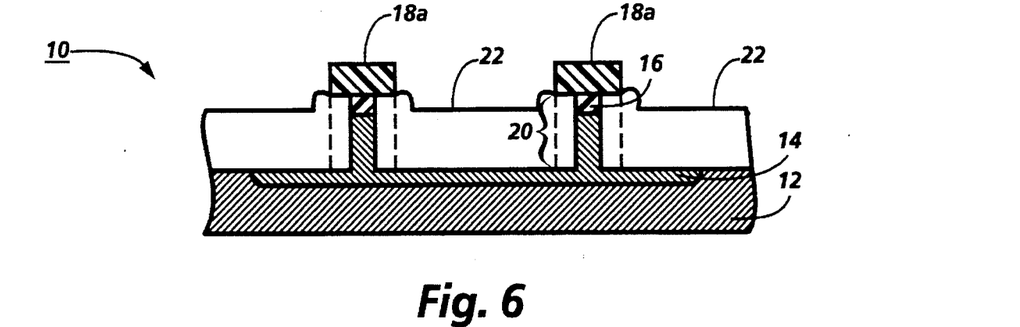
FIG. 6 shows in cross-section a structure at a stage following oxidation in the process of forming a light emitting device of an indirect bandgap material according to one embodiment of the present invention.

Next, columns 20, within which the p-n (or p-i-n) junction resides, must be thinned to obtain the requisite quantum confinement. This is accomplished by oxidizing the columns using $O_2$ or $H_2O$ in a temperature range around 850° C. The dots 18a act as an oxidation mask. As is well reported (see, e.g., D. B. Kao et al., *Two-Dimensional Thermal Oxidation of Silicon-I. Experiments*, IEEE Trans. on Electron Dev., vol. ED-34, no. 5, p. 1008 (1987)) use of a mask to prevent oxidation always results in oxide encroachment underneath the mask. This effect is employed to narrow the columns under dots 18a. At the same time, the growth of oxide 22 proceeds to fill the interstitial regions between the columns. The oxidized structure with oxide 22 is shown in FIG. 6.

The step of oxidation provides a number of benefits that make the method of the present invention feasible and practical. For example, the oxidation rate slows drastically as the radius of curvature of remaining Si decreases (see, e.g., R. Okada et al., *Oxidation Property of Silicon Small Particles*, Appl. Phys. Lett. 58, no. 15, p. 1662 (1991); D. Liu et al., *Fabrication of Wedge-Shaped Silicon Field Emitters With nm-Scale Radii*, Appl. Phys. Lett. 58, no. 10, p. 1042 (1991); D. B. Kao et al., *Two-Dimensional Thermal Oxidation of Silicon-I. Experiments*, IEEE Trans. on Electron Dev., vol. ED-34, no. 5, p. 1008 (1987)) thus leading to uniformization of column diameters and providing enhanced control of the final stages of the thinning. Furthermore, the $Si/SiO_2$ interface is a stable, passive, high bandgap Si termination that is effective in a bipolar device. In addition, RIE induced damage at the intrinsic, p-type, and n-type Si surfaces is consumed in the oxidation process. Finally, for impurities such as arsenic for which the segregation coefficient is very small, that is, the equilibrium concentration of the impurity in the oxide is much lower than that in the silicon, the dopant atoms tend to be eliminated from the oxide as it is grown and driven forward into the Si core. Thus, still another benefit of oxidation is that the dopant concentration in the columns is increased by the oxidation process.

The oxidation is terminated when the remaining, unoxidized Si in the columns is 2–3 nm wide. This step can be calibrated or monitored by photoluminescence from the sample when pulled to a cool region in the oxidation reactor. The oxidation temperature can be reduced as the termination point is approached to increase control. The oxide can then be annealed to allow viscous relaxation and stress relief, if necessary.

Figure 6A:
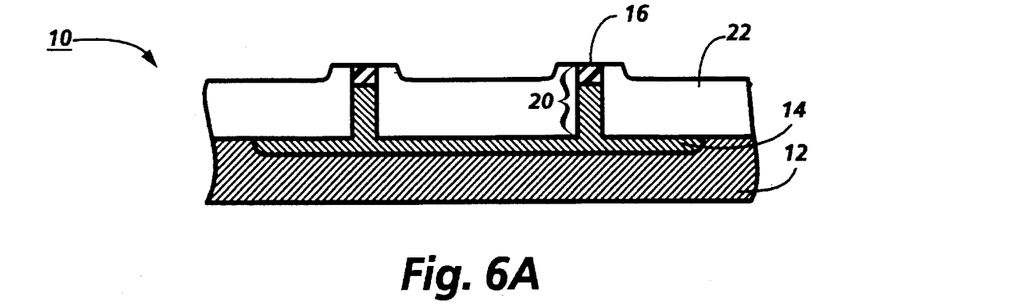
FIG. 6A shows the structure of FIG. 6 having the insulative dots removed for further processing.
Figure 7:
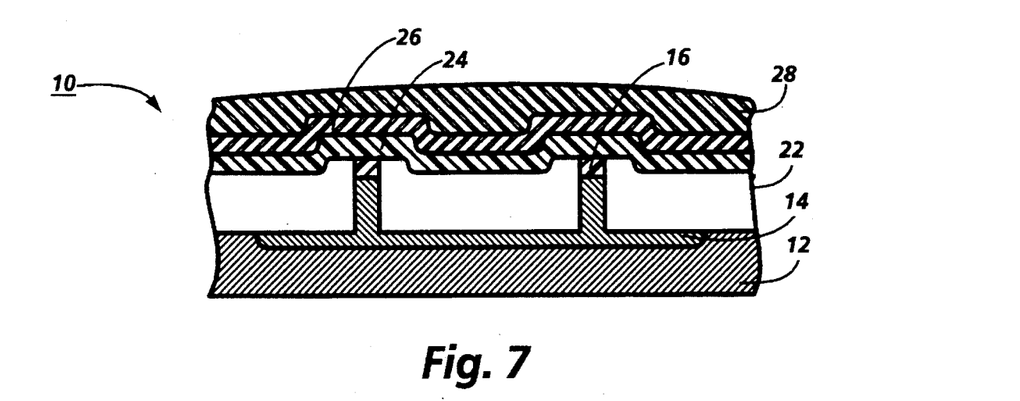
FIG. 7 shows in cross section a structure following deposition of metal contacts, a transparent metal contact layer, and a transparent encapsulating material, according to another embodiment of the present invention wherein the columns are initially terminated with insulative material material.

To complete the structure, electrical contact must be made with the thinned columns. Dots 18a are stripped (e.g., using phosphoric acid for $Si_3N_4$ dots) without affecting the remaining structure, as shown in FIG. 6A. A chrome flash 24 is deposited atop the columns as shown in FIG. 7. This chrome flash serves to improve the adhesion and electrical contact between the silicon and a subsequently deposited metal layer. A transparent metal layer such as indium tin oxide (ITO) 26 is then deposited to make electrical contact with flash 24 to thereby contact each of the columns. A transparent, encapsulating material such as polyimide 28 is then deposited or spun on to passivate and structurally protect the underlying columns.

Figure 15:
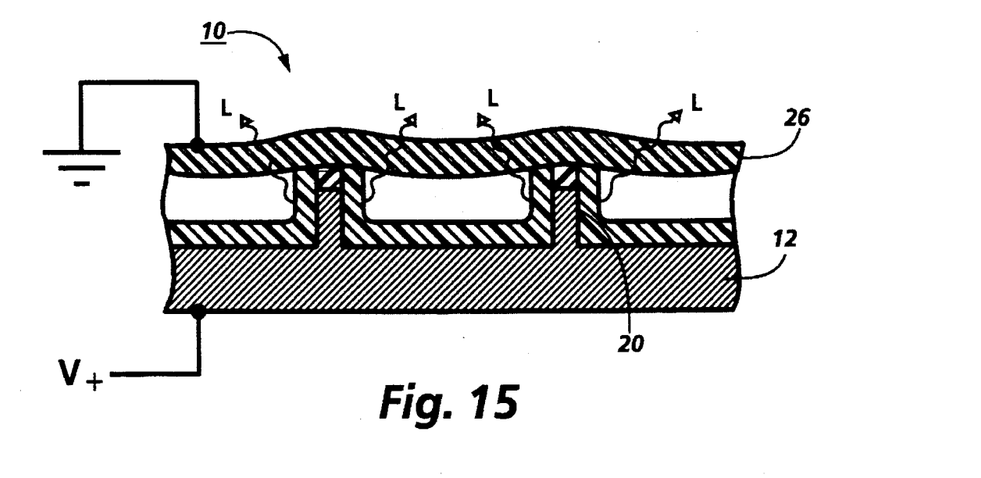
FIG. 15 shows schematically and in cross section a device according to one embodiment of the present invention connected to a current supply and to ground so as to emit light.

In operation, a bias is applied to apparatus 10, using layer 26 and substrate 12 (or alternatively a via contact, not shown, to the p-well) as the electrical contacts. The applied bias is sufficient to cause electrons and holes to migrate toward each other and combine in the columns 20. Light is generated thereby at room temperature operating conditions, which is represented by arrows L in FIG. 15. The light generated is transmitted through any oxide, encapsulating, and transparent metal contact layers, and is emitted through the surface of apparatus 10, where it may be directed and used for appropriate purposes.

Figure 8:
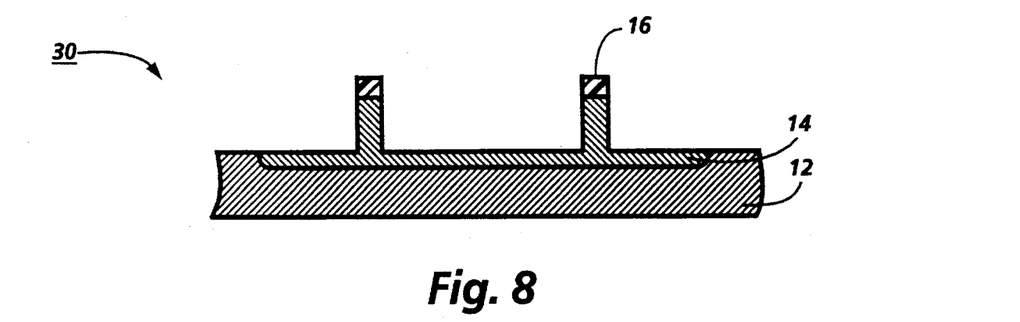
FIG. 8 shows a variation of the structure shown in FIG. 5 in which no dots remain atop the columns after etching.
Figure 9:
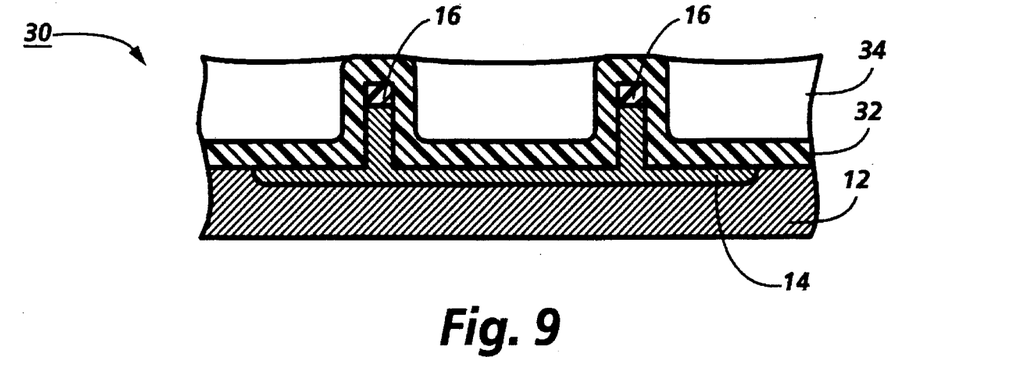
FIG. 9 shows the structure of FIG. 8 at a point later in the process of forming the luminescent apparatus in which the structure has been oxidized and a transparent insulative material deposited between the columns.
Figure 10:
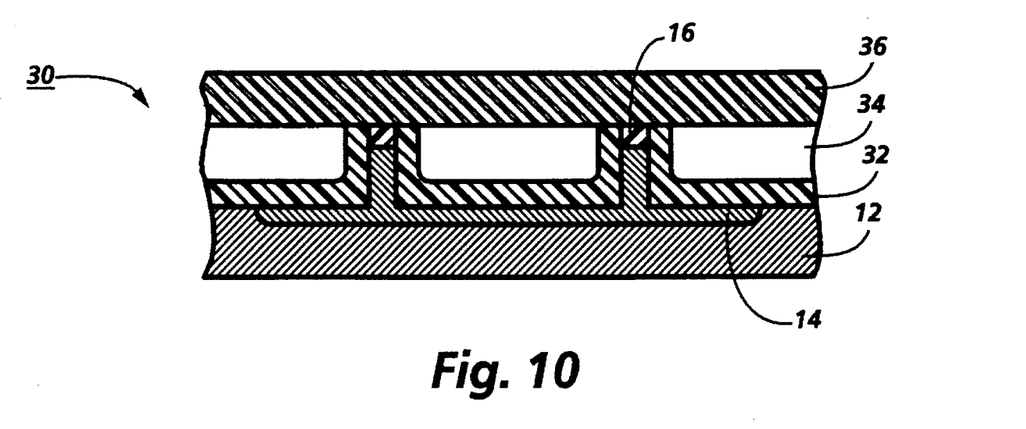
FIG. 10 shows the structure of FIG. 9 at a point later still in the process of forming the luminescent apparatus in which the structure has been planarized and a metal contact layer applied.

A number of variations of the above process for forming an LED of indirect gap material are contemplated. For example, it is possible to form dots 18a of a material which is etched along with the Si during formation of the columns. This would leave a structure 30 like that shown in FIG. 8. Oxidation would then proceed as described above, with the difference that the oxide 32 would form on the tops of the columns as well as the sides. This is shown in FIG. 9. A transparent insulator material 32 (such as $SiO_2$, $Si_3N_4$, polyimide, etc.) is then deposited in the interstices between the columns, as shown in FIG. 9. The structure is then planarized by an appropriate method to expose n-type material from each column, as shown in FIG. 10. Gas annealing may then be performed, and a transparent metal contact layer 36 then deposited by sputtering or other means to provide an ohmic contact, as shown in FIG. 10.

Another variation of the basic process described above would be to utilize a self-aligning nano-scale mask (not shown), such as one formed from self aligning spheres. See, e.g., H. W. Deckman, *Applications of Surface Textures Produced With Natural Lithography*, J. of Vacuum Science and Tech. B, vol. 1, no. 4, p. 1109 (1983). These spheres are formed of polystyrene or similar material with a diameter in the range of 20–200 nm. The spheres are suspended in a low density, high vapor pressure liquid such as methanol which is deposited on the surface of the substrate, silicon nitride, silicon dioxide, etc. When the substrate is spun at, for example, about 30 rpm, the spheres are distributed into a self-organized monolayer. The liquid suspending the spheres may then be evaporated by drafting with warm, dry $N_2$, etc. Low power RIE may then be performed using the remaining dry monolayer as a mask (taking care not to melt the spheres). The spheres may then be removed, for example by washing the wafer.

Yet another variation is the formation of dots 18a of a non-oxidizing metal such as palladium or metal multilayers. In addition to the above-discussed requirements of minimal oxidation and interdiffusion governing the choice of material for dots 18a, an additional constraint on the choice of metals in this embodiment is that the metal and Si must not form a eutectic with eutectic temperature below the highest processing temperature. Other material/processing limitations are that the material from which dots 18a are formed must not oxidize significantly during processing, and interdiffusion between the dot material and silicon must be minimal. One appropriate method for forming dots 18a would be to evaporate an appropriate metal through the interstices of the aforementioned array of spheres.

Figure 11:
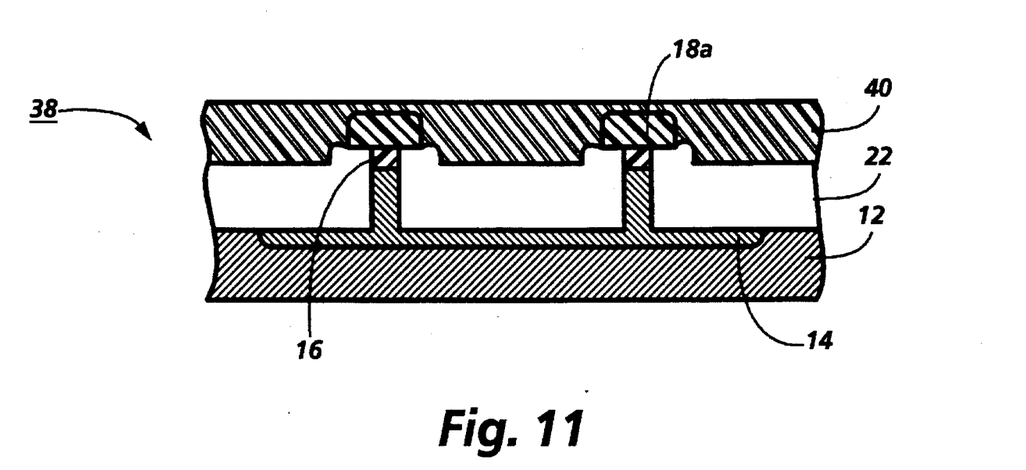
FIG. 11 shows in cross section a variation of the structure of FIG. 6, in which the dots terminating the columns are formed of a metal material, following deposition of a transparent metal contact layer and a transparent encapsulating material.

Referring to structure 38 shown in FIG. 11, when dots 18a are formed of the proper metal, all processing steps may be performed as described above, except that the dots 18a need not be removed when making ohmic contact to the columns. Rather, after oxidation, a layer 40 of transparent conductor such as ITO is deposited over the oxide 22 and dots 18a which electrically connects the columns. Although the introduction of the metal dots 18a in some reactor systems may not be desirable, fewer steps are required to fabricate an LED of indirect gap material according to this embodiment, possibly leading to specially designed systems for fabrication of such devices.

Still another variation would be to use a substrate other than crystalline silicon. For example, a substrate of sapphire or glass could have single crystal or poly crystalline silicon deposited thereon, the silicon being subject to the above process for forming an LED. Furthermore, the substrate itself may be a direct gap material, such as GaAs having deposited thereon a layer of indirect gap material such as AlGaAs, or other similar compound structure.

Further still, the p-type substrate may have formed or deposited directly upon it a material which is not a semiconducting material but which does serve as a source of carriers (e.g., electrons). As an example, the material in this case might be an appropriate metal (for example platinum) so as to thereby form a Schottky-type diode device. In one embodiment of the Schottky-type diode device, quantum confinement in multiple dimensions could be provided as discussed above. In another embodiment of the Schottky-type diode device, the p-type substrate would be comprised of porous silicon, such as that described by L. T. Canham in *Silicon Quantum wire Array Fabricated by Electrochemical and Chemical Dissolution of Wafers*, Appl. Phys. Lett. 57, no. 10, p. 1046 (1990). In this embodiment, portions of the silicon substrate are etched to provide columnar structures similar in scale to the column cores described above (on the order of tens of angstroms wide). A conformally depositing, passivating, transparent insulator (such as parylene) is deposited over the structure to a thickness of, for example, 100 Å. The parylene is then planarized by lateral ion milling or equivalent process until the tops of the silicon structures are exposed. Finally, a chrome flash or similar material is applied, then covered with a transparent conductor such as ITO to provide electrical contact to the columnar structures.

We now describe an alternative embodiment of the present invention in which the longitudinal axis of the semiconductor quantum wire structure lies parallel to the substrate surface (i.e., horizontal). Broadly, there are two primary difficulties in realizing electroluminescence in practical structures of indirect gap semiconductor material. First, the luminescent structure must have extremely small dimensions. This requirement has been addressed above. However, the second requirement is fabrication of an IC compatible device that utilizes the structure. In order to provide an alternative structure for incorporation into a device strategy, the present invention may be fabricated into planar structures as described below.

Figure 12:
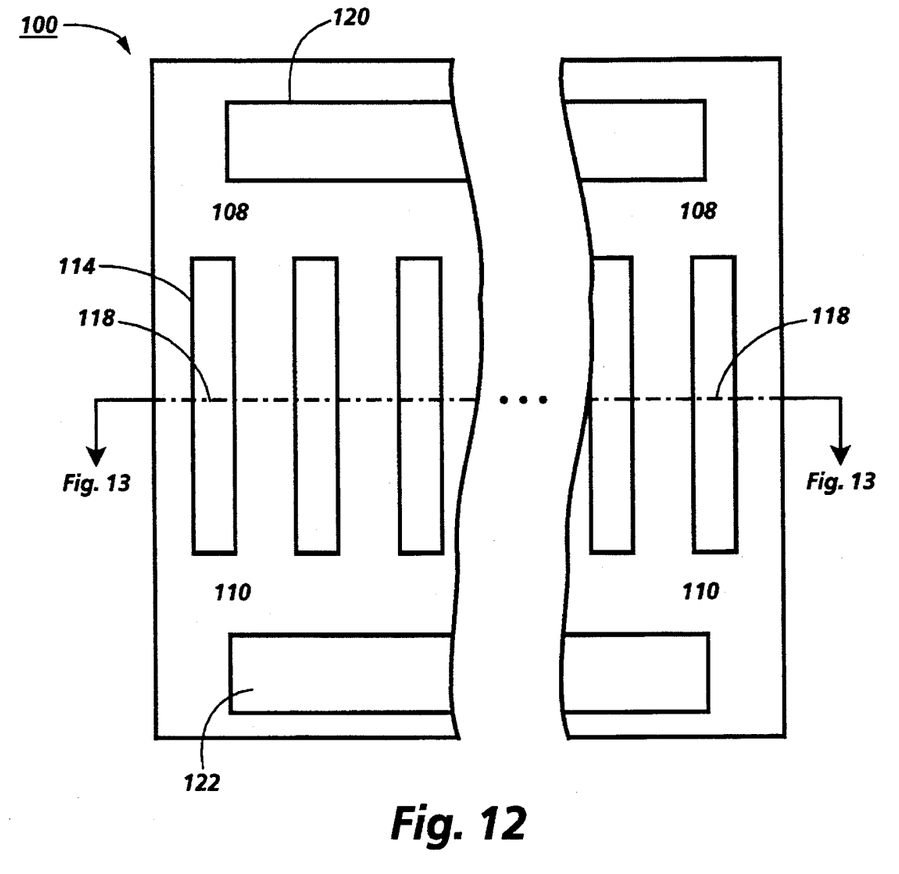
FIG. 12 shows a plan view of another embodiment of the present invention in which the luminescent structures are quantum wires extending in a plane parallel to the plane of the substrate surface.
Figure 13:
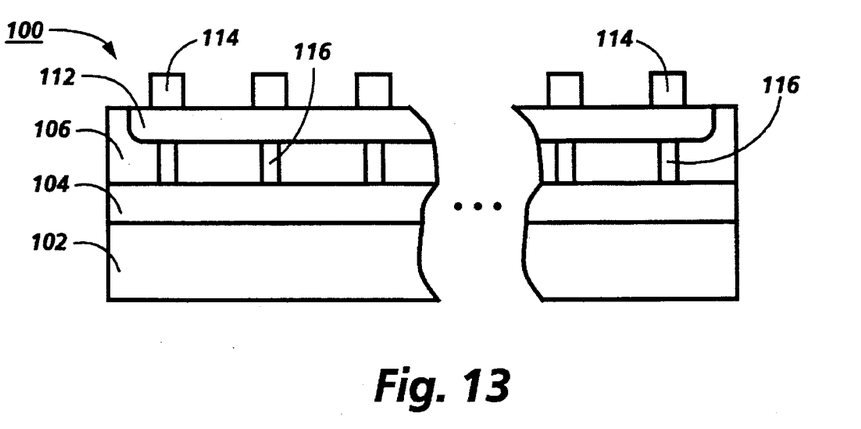
FIG. 13 shows a profile, cutaway view the embodiment shown in FIG. 12.

FIG. 12 is a top view and FIG. 13 is a side view of an apparatus 100 employing such structures. With reference to those Figures, a silicon substrate 102 is provided with a region of SIMOX or buried oxide 104 below a crystalline silicon top layer 106. A region 108 of the silicon top layer 106 is implanted with p-type impurities (here shown as the top portion of apparatus 100 when viewed from above), and a complementary region 110 is doped n-type (here shown as the bottom portion of the apparatus 100 when viewed from above). A surface oxide 112 is next grown in silicon top layer 106 which may be used to tailor the subsequently formed quantum confinement structures. Next, silicon nitride is deposited and patterned into stripes 114 on, and extending across, the upper surface of the silicon top layer 106. These stripes 114 are shown as extending substantially the length of the upper surface of silicon top layer 106, although, since they will define the length of the quantum confined structures, they may extend in a similar direction to a greater or lesser extent depending on the desired final dimensions of the quantum confined structures. One requirement of stripes 114, however, is that whatever their length, they span across the boundary between p-type region 108 and n-type region 110. Oxidation is then performed from the upper surface of silicon top layer 106, using the silicon nitride stripes 114 as oxide masks. Due to the aforementioned encroachment, the result is oxidation of layer 106 except for narrow core regions 116 thereof underlying the stripes 114 which remain as unoxidized crystalline silicon. Alternatively, RIE may be employed, again using stripes 114 as masks, to open cavities (not shown) in the interstitial regions between and below the stripes 114. Oxidation may then proceed in a lateral fashion, controlled to form cores 116 of crystalline silicon. Subsequently, stripes 114 may be removed if necessary. The narrowing of cores 116, formed by either method, proceeds until the cores are on the order of 2–3 nm, thereby forming quantum confinement structures. The cores are quite long as compared to their width and height, and hence may be referred to as "quantum wires." Each quantum wire contains a p-n (or equivalently a p-i-n) junction 118, thus forming an LED. Contacts 120 and 122 are formed by an appropriate process to complete the device. (If necessary, isolation from below can be provided by adjustable electrostatic isolation (e.g., a p-n junction) from the substrate 102). Light emission will be through the exposed upper surface of the oxidized silicon top layer 106. Thus, the previous discussion regarding the index of refraction of the columnar quantum confinement apparatus applies to this apparatus as well. Therefore, the surface oxide layer 112 may be designed to maximize the total flux of emitted light through interferometric effects.

Figure 16:
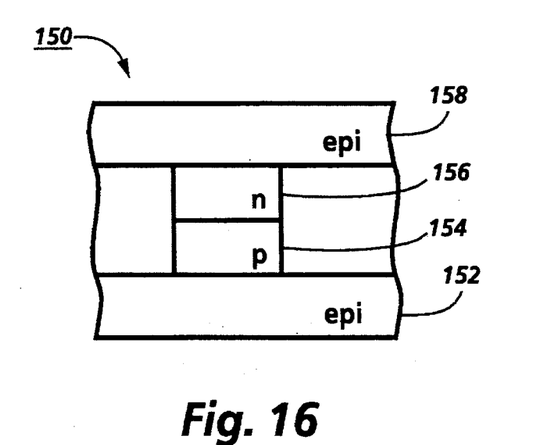
FIG. 16 shows a structure exhibiting quantum carrier confinement in three dimensions having an epitaxial underlayer on which quantum columns are formed, terminated by an additional epitaxial layer such that the carriers are confined vertically within the columns.

Finally, the present invention may readily be employed in structures exhibiting quantum carrier confinement in three dimensions. These structures, often referred to as "quantum dots" may be provided by a number of methods. With reference to FIG. 16, for example, a structure 150 may be provided starting with an epitaxial underlayer on which the above described quantum columns are formed, including p-type region 154 and n-type region 156. The columns are terminated by an additional epitaxial layer 158 such that the carriers are confined vertically within the columns. When the extent of this confinement approaches the de Broglie wavelength, the carriers are quantized, as described above, in a third dimension. Other examples may be found in the literature, such as A. Scherer et al., *Fabrication of Microlasers and Microresonator Optical Switches*, Appl. Phys. Lett., vol. 55, no. 26, p. 2724 (1989), and M. B. Stern et al., *Fabrication of 20-nm Structures in GaAs*, Appl. Phys. Lett., vol. 45, no. 4, p. 410, (1984).

Figure 14:
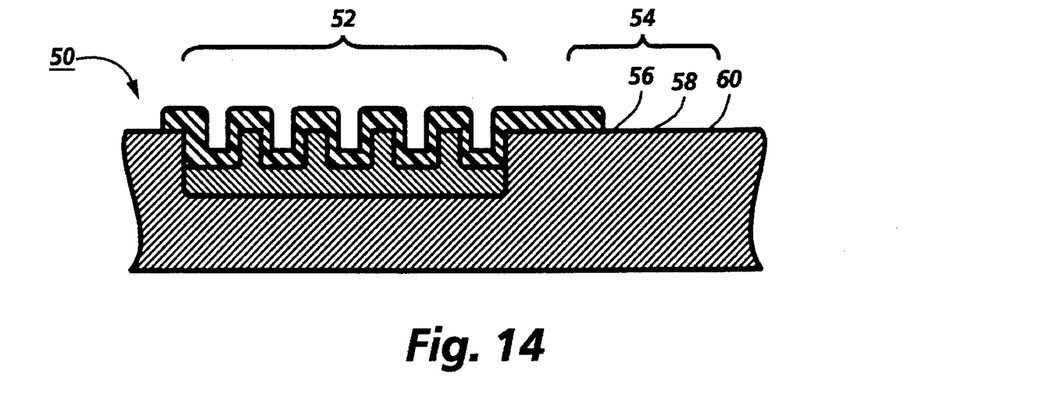
FIG. 14 shows in cross section an illustration of one embodiment of a monolithic VLSI structure including both an electrical (FET) and optical (LED) component according to one embodiment of the present invention.
Figure 14A:
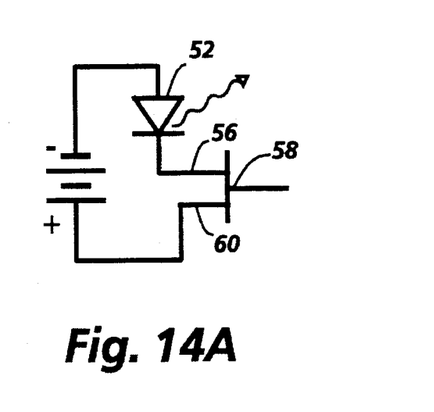
FIG. 14A shows a schematic circuit illustration of the embodiment of a monolithic VLSI structure including both an electrical (FET) and optical (LED) component according to the present invention.

One distinct advantage of producing light emitting structures from indirect bandgap materials such as crystalline silicon is that the processing of these materials is fairly well understood from the work done to produce well known electronic structures such as integrated circuit devices, etc. Yet another advantage is that those same electronic structures, such as control, logic, etc., as well as other optical structures such as light detectors, waveguides, etc., may be fabricated monolithically with the light emitting structures. FIG. 14 shows one embodiment 50 of such a monolithic integration. As shown schematically in FIG. 14A, LED array 52 (comprised of LEDs of any of the types described herein, or their equivalents) is electrically interconnected to a field effect transistor (FET) 54 consisting of drain 56, source 58, and gate 60, so that FET 54 may control its operation. Various other devices and interconnection arrangements will be apparent to those skilled in the art. For example, the array of light emitting structures of indirect gap material may be monolithically formed contemporaneously with other components, or the array and/or the other components may be preconstructed and subsequently processed or joined for integrated operation.

LEDs with different core diameters emit light with different wavelengths. Therefore, different colored LEDs can be driven on the same chip by separate drivers. In addition to varying the diameters of the dots 18a, other methods for fabricating LEDs with different core diameters include time-sequenced RIE formation of columns, anti-oxidation coatings on columns to delay oxidation initiation, etc. Only low resolution masking is required for these operations.

In general, to those skilled in the art to which this invention relates, many changes in construction and widely differing embodiments and applications of the present invention will suggest themselves without departing from its spirit and scope. For example, the above description has focussed on luminescent structures formed of silicon. However, other indirect gap semiconductor materials may also serve as the foundation of luminescent structures formed and operated according to the present invention. Furthermore, the structures described above have employed two-dimensional quantization to bring about luminescence from indirect gap semiconducting materials. The same principles, and manufacturing techniques, may be employed to form structures with three-dimensional quantization (e.g., so-called "quantum dots") which operate and are formed according to the present invention. Thus, the disclosures and descriptions herein are illustrative, and are not intended to be in any sense limiting.

What is claimed is:

1. A method for fabricating a quantum nanowire, comprising the steps of:

providing a substrate of an indirect bandgap semiconducting material;

forming a p-n junction on a surface of the substrate, the p-n junction having a first region of a first conductivity type adjacent and below a second region of a second conductivity type wherein the first region is formed in the substrate;

etching the first region and the second region to form a column of indirect bandgap semiconducting material;

oxidizing the column while retaining unoxidized a vertical core of the column, said oxidizing step enabling quantum carrier confinement in two dimensions; and connecting the first region and the second region with electrical contacts so that the vertical core may be electrically biased.

2. A method according to claim 1, wherein said forming step includes the steps of:

doping the first region of the first conductivity type with p-type impurities to form a p-type region; and doping the second region of the second conductivity type with n-type impurities to form an n-type region.

3. A method according to claim 1, wherein said etching step includes the steps of:

depositing an insulating layer on the surface of the substrate; and patterning a dot with a diameter of approximately 20 nm in the insulting layer.

4. A method according to claim 3, wherein the dot is patterned using electronic beam lithography.

5. A method according to claim 3, further comprising the step of etching the substrate not covered by the dot in the insulating layer using reactive ion etching.

6. A method according to claim 3, wherein said oxidizing step narrows the column to approximately 2 nm by using the dot of insulating material as an oxidation mask.

7. A method according to claim 3, wherein said connecting step includes the steps of:

stripping the dot of insulating material from the surface of the substrate; and depositing a transparent metal layer on the surface of the substrate.

8. A method according to claim 2, further comprising the step of depositing a chrome flash on the exposed surface of the second region to improve the adhesion and electrical contact between the second region and the transparent metal layer.

9. A method according to claim 1, wherein said oxidizing step oxidizes the column using $O_2$ at a temperature of approximately 850° Celsius.

10. A method according to claim 11, wherein said connecting step induces carrier recombination so that the column emits light.

11. A method according to claim 1, wherein said forming step includes the steps of:

doping the first region of the first conductivity type with n-type impurities to form a n-type region; and doping the second region of the second conductivity type with p-type impurities to form an p-type region.

12. A method according to claim 1, wherein said forming step forms the second region in and adjacent to the surface of the substrate.

13. A method according to claim 1, wherein said forming step forms the second region above and adjacent to the surface of the substrate.

14. A method for fabricating an array of quantum nanowires, comprising the steps of:

providing a substrate of an indirect bandgap semiconducting material;

forming on a surface of the substrate a first region of a first conductivity type, said forming step including the step of forming a second region of a second conductivity type adjacent and above the first region;

etching the first region and the second region to form an array of columns of indirect bandgap semiconducting material;

oxidizing the array of columns while retaining unoxidized a vertical core of each of the columns, said oxidizing step forming an array of vertical cores that enable quantum carrier confinement in two dimensions; and depositing a generally transparent metal layer over the array of vertical cores, the generally transparent metal layer providing electrical communication with each of the vertical cores.

15. A method according to claim 14, wherein said providing step includes the steps of:

doping the first region of the first conductivity type with p-type impurities to form a p-type region; and doping the second region of the second conductivity type with n-type impurities to form an n-type region.

16. A method according to claim 15, further comprising the step of forming in the substrate of indirect bandgap semiconducting material an undoped layer of material between the first region and the second region to form a p-i-n region.

17. A method according to claim 14, wherein said etching step retains a portion of the first region sufficient to interconnect the array of columns.

18. A method according to claim 14, wherein said etching step etches the first region and the second region to form an array of columns having a diameter of approximately 20 nm with a center-to-center spacing of approximately 50 nm.

19. A method according to claim 14, wherein said oxidizing step fills interstitial regions between the vertical cores.

20. A method according to claim 14, wherein said forming step forms the first region in the substrate and the second region above the surface of the substrate.

21. A method according to claim 14, wherein said forming step forms the first region and the second region in the substrate.

22. A method for forming an array of quantum nanowires on a substrate of crystalline silicon material, comprising the steps of:

forming a buffed oxide layer in the crystalline silicon substrate below a crystalline silicon layer;

doping the crystalline silicon layer to form a first region of the crystalline silicon substrate with p-type impurities and a second region of the crystalline silicon substrate adjoining the first region with n-type impurities, the first region and the second region being formed above the buffed oxide layer and in an unoxidized portion of the crystalline silicon substrate;

growing a surface oxide layer in both the first region and the second region of the crystalline silicon substrate, said growing step retaining a layer of the first region and the second region between the buffed oxide layer and the surface oxide layer;

depositing silicon nitride stripe regions on the surface oxide layer, the silicon nitride stripe regions overlaying a portion of the first region and the second region;

oxidizing the first region and the second region, said oxidizing step using the silicon nitride stripe regions as masks to form unoxidized core regions of the first region and the second region, each unoxidized core region including a p-n junction that enables quantum carrier confinement in multiple dimensions; and forming electrical contacts to the first region and the second region.

23. A method according to claim 22, wherein said step of forming electrical contacts to each first region and second region enables each p-n junction to be electrically biased to induce carrier recombination and thereby emit light.

24. A method according to claim 22, further comprising the step of etching a region on the substrate not covered by the stripes of insulating material using reactive ion etching, the stripes of insulating material acting as an etching mask in order to open cavities in the interstitial regions between and below the silicon nitride stripe regions.

* * * * *